United States Patent [19]

Kwon

[11] Patent Number: 5,712,752
[45] Date of Patent: Jan. 27, 1998

[54] INPUT/OUTPUT PROTECTING CIRCUIT AND A PROTECTION ELEMENT

[75] Inventor: Kyu-hyung Kwon, Puchon, Rep. of Korea

[73] Assignee: Samsung Electronics Co., Ltd., Suwon, Rep. of Korea

[21] Appl. No.: 576,215

[22] Filed: Dec. 21, 1995

[30] Foreign Application Priority Data

Dec. 22, 1994 [KR] Rep. of Korea .................. 94-35828

[51] Int. Cl.[6] .................................................. H02H 9/04
[52] U.S. Cl. .......................................... 361/56; 361/90
[58] Field of Search ............................ 361/18, 56, 58, 361/86, 90–92, 111, 119

[56] References Cited

U.S. PATENT DOCUMENTS 5,521,789  5/1996  Ohannes et al. ................ 361/111
5,581,104  12/1996  Lowrey et al. .................. 257/355
5,644,460  7/1997  Clukey ............................ 361/56

Primary Examiner—Ronald W. Leja
Attorney, Agent, or Firm—Cushman Darby & Cushman IP Group of Pillsbury Madison & Sutro LLP

[57] ABSTRACT

Disclosed is a circuit for protecting a semiconductor device from the static electricity by discharging static electricity. When a p+/n− diode of positive direction to VDD or a PMOS transistor is not usable because a voltage higher than VDD is applied, a vertical PNP transistor is connected to Vss and positive static electricity is discharged. Negative static electricity is discharged by using an n+/p− diode connected to Vss direction through a semiconductor substrate. Additionally, in case of a circuit to which either a voltage higher than VDD, or a voltage lower than Vss (=0[V]) is inputted, or outputted, a discharging path is formed with respect to negative static electricity by the operation of a vertical NPN bipolar junction transistor connected to VDD. Positive static electricity is discharged via a p+/n− diode connected to VDD.

2 Claims, 3 Drawing Sheets

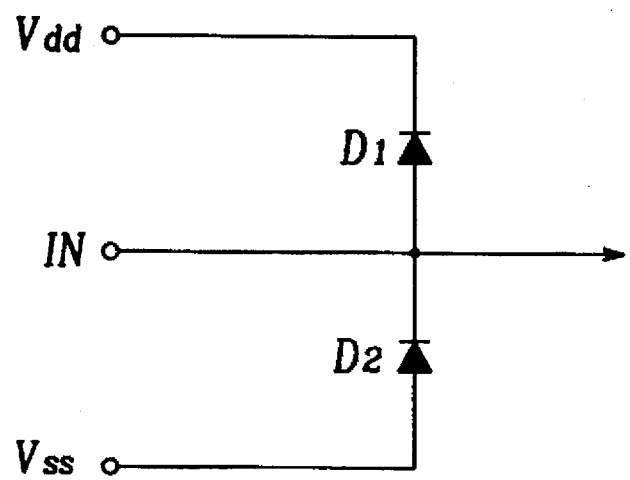
FIG.1 <Prior Art>

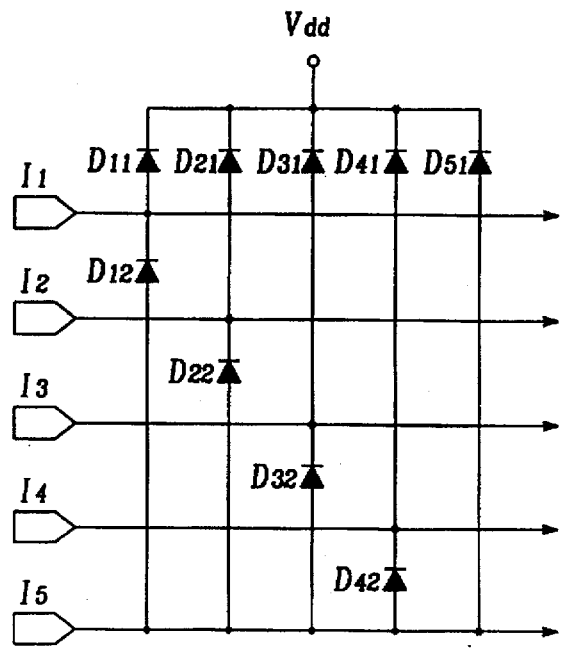
FIG.2 <Prior Art>
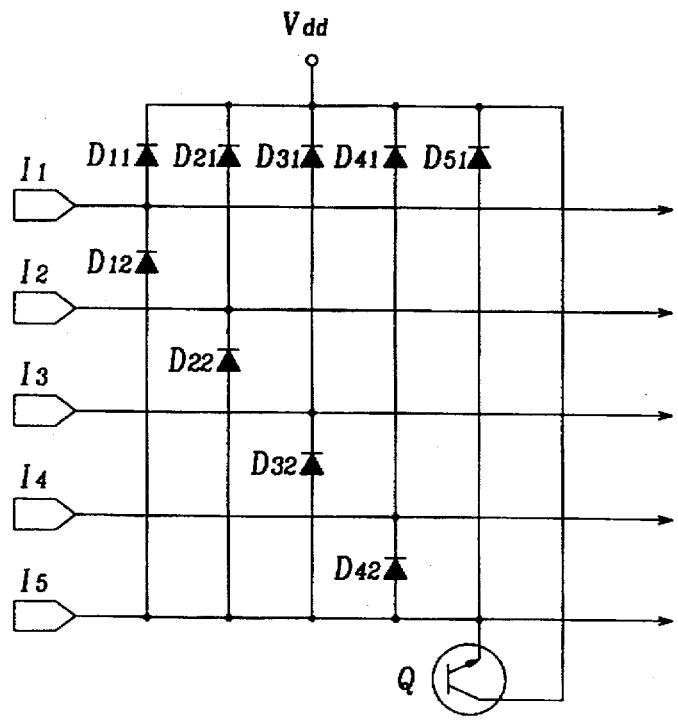
FIG.3

5,712,752

INPUT/OUTPUT PROTECTING CIRCUIT AND A PROTECTION ELEMENT

BACKGROUND OF THE INVENTION

(1) Field of the Invention

The present invention relates to an input/output protecting circuit and protection element, particularly to a circuit and protection element for protecting an inner circuit from a voltage higher than an operation voltage or lower than a reference voltage.

(2) Description of the Prior Art

A general input/output protecting circuit is attached to protect an inner circuit when a sudden high voltage is applied to an input pad or an output pad. The sudden high voltage is occurred from an electrostatic discharge ESD. A diode, a resistor and a transistor may be used for such kind of protection element mounted in a protecting circuit.

A conventional input/output protecting circuit is described with referring to the attached drawings. However, for a convenience of a description, an input/output pad will be described as an input pad.

FIG. 1 is a circuit diagram illustrating a conventional input/output protecting circuit composed of a couple of diodes.

The two diodes D1 and D2 are connected in parallel, one in a forward direction and the other in a reverse direction from input pad IN. An output pad of the diode D1 in a forward direction is connected to a power voltage Vdd and an output pad of the diode D2 in a reverse direction is connected to a reference voltage or the ground voltage Vss. The diode is a formed of a n+/p–junction. In this kind of protecting circuit, once a positive voltage + is applied, the current is emitted through the diode D1 in a forward direction to a power source and once the negative voltage − is applied, the current is emitted through the diode D2 in a reverse direction to a ground.

However, as illustrated in FIG. 2, in the circuit having a plurality of input pads I1, I2, I3, I4 and I5, a pair of diodes of forward and reverse directions Di1 and Di2 (i=1, 2, 3 and 4) are inserted to function as a protecting circuit to each input pad Ii (i=1, 2, 3 and 4) except for an input pad I5 to which a reference voltage lower than the voltage applied to all other input pads is applied. However when using a typical protecting circuit connected to a power source and a ground as of FIG. 1, the protecting circuit may be operated during the operation of the inner circuit, and therefore the input pads of the diodes D12, D22, D33 and D44 in reverse directions are connected to an input pad I5 to which the reference voltage is applied instead of being connected to the ground voltage.

On the other hand, a diode D51 in a forward direction connected to power voltage Vdd is connected to the reference voltage input pad I5. A pair of diodes function with the same operation as described above with the high voltage inputted to each input pad. However in the conventional input/output protecting circuit, when a high negative voltage–is applied to the input pad I5 to which a diode in a reverse direction, the inner circuit may be damaged for not having a discharging path.

SUMMARY OF THE INVENTION

An object of the invention is to protect the inner circuit from the voltage even if a voltage lower than the reference voltage is inputted thereto.

The circuit according to the present invention for protecting the inner circuit from a voltage higher than the operation voltage or a voltage lower than the reference voltage applied through the pad to the inner circuit comprises a diode being connected to the pad of the inner circuit, an NPN transistor having an emitter connected to the pad of the inner circuit, a collector connected to the power voltage and a floating base, wherein the protection element comprises a first conductive type semiconductor substrate, a first area of second conductive type formed on the substrate and cut off from the outside, a second area of the first conductive type and a third area of the first conductive type of higher density than the substrate on the substrate.

BRIEF DESCRIPTION OF THE DRAWINGS

FIG. 1 is a circuit diagram illustrating a conventional input/output protecting circuit composed of a couple of diodes;

FIG. 2 is a circuit diagram illustrating a conventional circuit for protecting a circuit having a plurality of input pads;

FIG. 3 is a circuit diagram illustrating an input/output protecting circuit according to a preferred embodiment of the invention.

DETAILED DESCRIPTION OF THE PREFERRED EMBODIMENTS

A preferred embodiment of the invention is described hereinbelow, with reference to the accompanying drawings.

As illustrated in FIG. 3, an input/output protecting circuit according to a preferred embodiment of the invention has the same structure as that of FIG. 2 except that a protection transistor Q as a protection element is connected to an input pad I5 which is not connected to a reverse direction diode. The protection transistor Q is an NPN transistor having a floating base, of which emitter is connected to the input pad I5 and the collector is connected to the power voltage Vdd. The protection transistor Q is a vertical npn transistor having the same cross section as illustrated in FIGS. 4 and 5.

Figure 4:
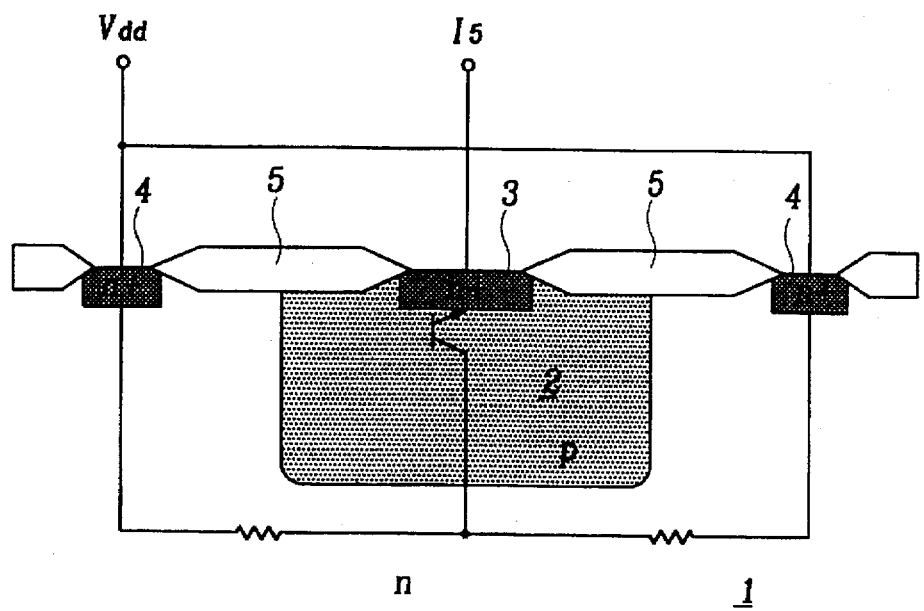
FIGS. 4 and 5 are the cross-sectional view illustrating a protection element of FIG. 3.

In the structure illustrated in FIG. 4, a p-base area 2 on an n-type substrate 1 used for a collector and an n+ area connecting the substrate 1 to outside and being isolated with the p-base are formed. An n+ emitter area 3 is formed in the base area 2 and an oxide film is formed between the emitter area 3 and the n+ area 4. The emitter area 3 is connected to the input pad I5 and the n+ area 4 is connected to the power voltage Vdd.

Figure 5:
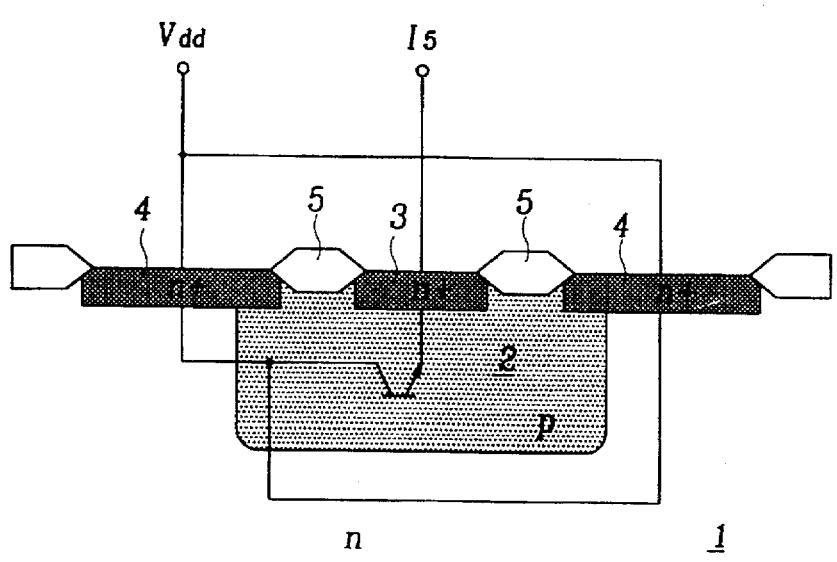

The structure of FIG. 5 has the same structure as that of FIG. 3 except that the n+ area 4 formed on the substrate 1 is connected to the base area 2. The n+ area 4 is connected to the base area 2 for discharging the current in a lower electrostatic voltage by lowering the breakdown voltage between the base and the collector. More particularly, because a breakdown voltage is closely related with a doping density in general, either the density of the base area 2 or the collector 3 should be raised to lower the breakdown voltage between the base and the collector. However, in the structure of FIG. 4, as the breakdown is occurred between the substrate 1 and the base area 2, either density of the two should be raised. However, as the substrate 1 is as a collector in the vertical pnp transistor, it is too difficult to increase the density of the substrate, but also difficult to increase the density of the base area 2 because if the density of the base area 2 is changed, the characteristics of the transistor also varied. Therefore, if the n+ area 4 is connected to the base area 2 according to the invention, the breakdown occurs earlier near the junction between the n+ area 4 and the base area 2 than near the junction between the substrate 1 and the base area 2 because the breakdown voltage near the junction between the n+ area and the base area 2 is lower than the break-down voltage near the junction between the substrate 1 and the base area 2.

If a negative voltage– is applied to thus-formed input pad I5, the junction of the emitter area 3 and the base area 2 is positively biased and the junction of the base area and the substrate is negatively biased. If a considerably large current is applied thereto, a depletion layer between the base area 2 and the substrate 1 is extended. If the extended depletion layer meets the emitter area 2, a current is discharged through the substrate 1 to the power source with the punch-through effect.

In this step, the reason why the npn transistor does not affect the general operation of the inner circuit is that a direct discharging path is not formed toward the input pad I5 because the base area is open, and the discharging path toward the power source is not formed because the voltage applied between the base and the collector is not as high as to generate the punchthrough effect.

Some elements affect on the operation of the NPN transistor to emit the static electricity efficiently. The primary factor of the variables with the construction, i.e. layout, is if the lateral distance from the junction of the base area and the substrate to the junction of the emitter area to the base area is shorter than the depth of the junction of the base area, the operation of the NPN transistor is generated in a lateral direction, therefore easily damaged by the static electricity. Therefore, in order to induce the electrostatic discharge by the operation of the vertical NPN transistor, the lateral distance from the junction of the base area and the substrate to the emitter should be longer than the depth of the junction of the base area.

Additionally, the p-well of the n+/p– diode constructed at input pads I1 to I4 should be isolated from the p-well of an input pad V5. If the p-well is not isolated, electrostatic flaws can occur because of an n+ extended domain of other neighboring input/output pads and a parasitic n+pn+ bipolar junction transistor operation.

The n+ extended domain which is the emitter, to bias on the n-type substrate which is a collector, should be laid out as near as possible to the edge of p-well as well in order to maximize the discharging effect by minimizing the parasitic resistance of the collector and to optimize the size of the diode taking into consideration of leakage current.

Therefore, semiconductors, manufactured to satisfy the above-mentioned conditions, discharge a positive static electricity by operation of the forward direction diode when a higher voltage than VDD is applied, and discharge on the contrary a static electricity in accordance with the traits of electric characteristics of the vertical NPN transistor connected between an input pad and VDD when a voltage lower than Vss is applied, thus protecting the internal circuits from damage.

What is claimed:

1. A protecting circuit for protecting an internal circuit from a first voltage lower than a reference voltage and a second voltage higher than the an operation voltage applied through a pad to said internal circuit, said protecting circuit comprising;

a diode connected between said pad of said internal circuit in forward direction to a voltage terminal, said diode providing a first discharge path between said pad and said voltage terminal when said second voltage is applied to said pad; and an NPN transistor having an emitter connected to said pad of said internal circuit, a collector connected to said voltage terminal, and a floating base, said NPN transistor providing a second discharge path between said pad and said voltage terminal when said first voltage is applied to said pad.

2. A protecting circuit defined in claim 1, wherein it further protects said internal circuit from said first voltage lower than said reference voltage and said second voltage higher than a second operation voltage applied through a second pad to said internal circuit, said operation voltage being higher than said operation voltage, said protecting circuit further comprising:

a second diode connected between said second pad of said internal circuit in forward direction to said voltage terminal, said second diode providing a third discharge path between said second path and said voltage terminal when said second voltage is applied to said second pad; and a third diode connected between said pad in forward direction to said second pad, said third diode providing a fourth discharge path between said second pad and said voltage terminal via said NPN transistor when said first voltage is applied to said second pad.

* * * * *